United States Patent
Jung et al.

(10) Patent No.: US 8,123,900 B2
(45) Date of Patent: Feb. 28, 2012

(54) SUBSTRATE SUPPORTING UNIT AND APPARATUS FOR TREATING SUBSTRATE USING THE SUBSTRATE SUPPORTING UNIT

(75) Inventors: Hye-Son Jung, Gyeonggi-do (KR); Seung-Ho Lee, Daegu (KR)

(73) Assignee: Semes Co. Ltd., Chungcheongnam-do (KR)

( * ) Notice: Subject to any disclaimer, the term of this patent is extended or adjusted under 35 U.S.C. 154(b) by 566 days.

(21) Appl. No.: 12/284,840

(22) Filed: Sep. 25, 2008

(65) Prior Publication Data
US 2009/0145552 A1    Jun. 11, 2009

(30) Foreign Application Priority Data
Oct. 12, 2007    (KR) .................. 10-2007-0102976

(51) Int. Cl.
*H01L 21/304*    (2006.01)
*C23C 14/50*    (2006.01)
(52) U.S. Cl. ............... 156/345.23; 134/902; 269/40
(58) Field of Classification Search ............. 156/345.23; 269/40; 134/902
See application file for complete search history.

(56) References Cited

U.S. PATENT DOCUMENTS

| | | | | |
|---|---|---|---|---|
| 4,256,229 A | * | 3/1981 | Lee | 211/41.18 |
| 5,370,142 A | * | 12/1994 | Nishi et al. | 134/61 |
| 5,704,494 A | * | 1/1998 | Nishikiori et al. | 211/41.12 |
| 6,814,808 B1 | | 11/2004 | Gados et al. | |
| 7,100,306 B2 | * | 9/2006 | Jun et al. | 34/380 |
| 2003/0106575 A1 | | 6/2003 | Moon et al. | |
| 2009/0145552 A1 | * | 6/2009 | Jung et al. | 156/345.23 |

FOREIGN PATENT DOCUMENTS

| | | | |
|---|---|---|---|
| CN | 1581458 A | | 2/2005 |
| JP | 06204195 A | * | 7/1994 |
| JP | H08-049073 A | | 2/1996 |
| JP | H09-260480 A | | 10/1997 |
| JP | H11-045933 A | | 2/1999 |
| KR | 10-0273938 | | 9/2000 |
| KR | 1020060086053 A | | 7/2006 |
| KR | 1020070095698 A | | 10/2007 |
| KR | 2020000016189 U | | 8/2010 |

OTHER PUBLICATIONS

Machine Generated English Translation of JP 09-260480 published Oct. 3, 1997.*
Japanese Office Action for Japance Application No. 2008-264246 dated May 27, 2011.

* cited by examiner

*Primary Examiner* — Sylvia R. MacArthur
(74) *Attorney, Agent, or Firm* — Jenkins, Wilson, Taylor & Hunt, P.A.

(57) ABSTRACT

Provided are a substrate supporting unit and a substrate treating apparatus using the substrate supporting unit. The substrate supporting unit comprises a base plate and a supporting portion formed on the base plate. The supporting portion comprises two supporting rods and a plurality of supporting members. The two supporting rods extend in a predetermined direction to be separated from each other. The plurality of supporting members is disposed to be separated from each other in the predetermined direction. Each of the supporting members connects the supporting rods.

14 Claims, 14 Drawing Sheets

SUBSTRATE SUPPORTING UNIT AND APPARATUS FOR TREATING SUBSTRATE USING THE SUBSTRATE SUPPORTING UNIT

CROSS-REFERENCE TO RELATED APPLICATION

This U.S. non-provisional patent application claims priority under 35 U.S.C. §119 to Korean Patent Application No. 10-2007-0102976, filed on Oct. 12, 2007, the entire contents of which are hereby incorporated by reference.

BACKGROUND OF THE INVENTION

The present invention disclosed herein relates to a substrate supporting unit and an apparatus for treating a substrate using the substrate supporting unit, and more particularly, to a substrate supporting unit stably supporting the substrate during a process and an apparatus for treating a substrate using the substrate supporting unit.

An electronic device such as a semiconductor memory device or a flat display device includes a substrate. The substrate may be a silicon wafer or a glass substrate. A plurality of conductive layer patterns and insulating layer patterns that insulate a plurality of different conductive layer patterns are formed on the substrate. The conductive layer patterns and the insulating layer patterns are formed using a series of processes such as an exposure, a development and an etching.

The series of processes are performed in a treating bath in which a treating solution is filled. Each of the treating baths has the same treating solution to perform the same process or a different treating solution to perform a different process. The treating baths may include a treating bath having a cleaning liquid for cleaning a substrate after treating the substrate with a process solution.

Regardless of a treating bath and a treating solution, substrates are dipped into the treating solution of the treating bath during a process. The substrates react to the treating solution and a process is performed. Thus, it is necessary that substrates are stably supported in the treating bath during a process. Particularly, since a large number of substrates are simultaneously treated at one process to improve a process efficiency, there is need of an instrument that can be used in various treating baths in common and at the same time, by which various substrates can be stably supported

SUMMARY OF THE INVENTION

Example embodiments provide a substrate supporting unit. The substrate supporting unit comprises a base plate and a supporting portion. The supporting portion is formed on the base plate at least one and supports a plurality of substrates arranged in a first direction. The supporting portion comprises two supporting rods and a plurality of supporting members. The two supporting rods extend in the first direction and are separated from each other. The plurality of supporting members is arranged to be separated from each other in the first direction, connects the supporting rods and is in contact with each of the substrates.

Example embodiments provide a substrate supporting unit. The substrate supporting unit comprises a base plate and a supporting portion. The supporting portion is formed on the base plate at least one and supports a plurality of substrates arranged in a first direction. The supporting portion comprises two sidewalls facing each other and a body connecting the two sidewalls. A plurality of slots are formed in the body so as to be in contact with the substrates.

Example embodiments provide a substrate treating apparatus. The substrate treating apparatus comprises a treating bath and a substrate supporting portion. A process is performed in the treating bath with respect to substrates. The substrate supporting unit is disposed inside the treating bath during a process and supports the substrates so that the substrates are vertically located on the supporting unit. The substrate supporting unit comprises a base plate and a supporting portion that is formed on the base plate at least one. The substrate supporting unit supports the substrates arranged in a first direction, and comprises two supporting rods and a plurality of supporting members. The plurality of supporting members is arranged to be separated from each other in the first direction, connects the supporting rods and is in contact with each of the substrates.

Example embodiments provide a substrate treating apparatus. The substrate treating apparatus comprises a treating bath and a substrate supporting portion. A process is performed in the treating bath with respect to substrates. The substrate supporting unit is disposed inside the treating bath during a process and supports the substrates so that the substrates are vertically located on the supporting unit. The substrate supporting unit comprises a base plate and a supporting portion that is formed on the base plate at least one. The substrate supporting unit supports the substrates arranged in a first direction. The supporting portion comprises two sidewalls facing each other and a body connecting the two sidewalls. A plurality of slots are formed in the body so as to be in contact with the substrates.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

Figure 1:
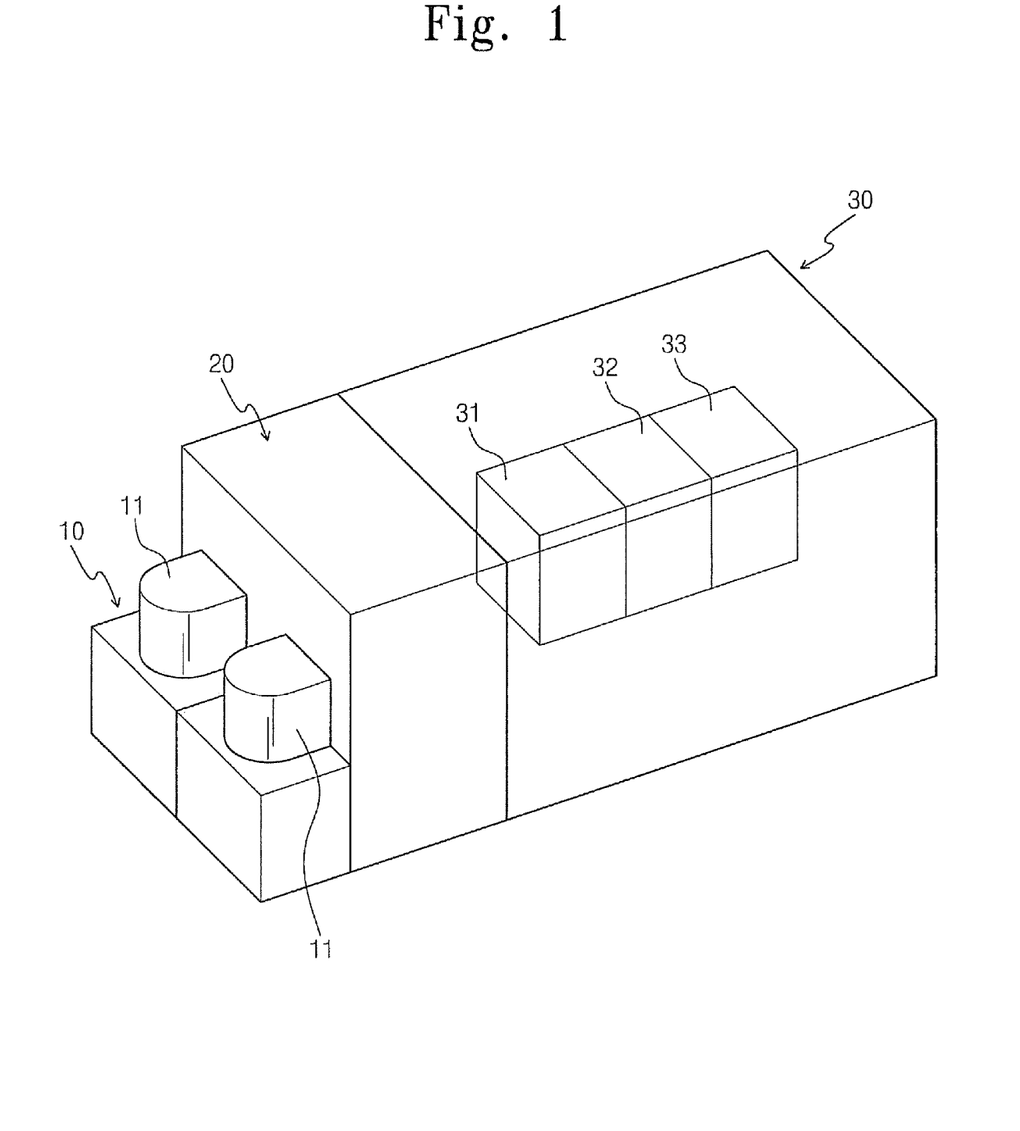
FIG. 1 is a perspective view of a substrate treating apparatus according to some embodiments of the present invention.

FIG. 1 is a perspective view of a substrate treating apparatus according to some embodiments of the present invention.

Referring to FIG. 1, a substrate treating apparatus includes a load port 10, a transfer unit 20 and a treating unit 30. A substrate such as a semiconductor wafer is loaded or unloaded on the load port 10. A plurality of wafers are treated at the same time using a cassette 11. One cassette 11 can maximally accommodate 25 wafers. Thus, using two cassettes, maximum 50 wafers can be treated at a time.

The transfer unit 20 receives wafers and transfers the wafers to the treating unit 30. A transfer robot (not shown) transferring wafers is disposed on a lower portion of the transfer unit 20.

The treating unit 30 treats wafers transferred from the transfer unit 20. The treating unit 30 includes a plurality of sub treating units. That is, the treating unit 30 includes a first sub treating unit 31, a second sub treating unit 32 and a third sub treating unit 33. As the need arises, the treating unit 30 may further include additional sub treating units except the first to third sub treating units 31, 32 and 33. Whenever necessary, a portion of the first to third sub treating units 31, 32 and 33 may be omitted.

Each of the first to third sub treating units 31, 32 and 33 includes a treating bath having a process solution for performing various processes applied to wafers. For example, the process may be an etching, a cleaning and a drying. Hydrofluoric acid, sulphuric acid, deionized water, isopropyl alcohol, nitrogen, etc, may be variously used as a process solution or a process gas during a process.

Process solutions filled in each of the treating baths of the first to third sub treating units 31, 32 and 33 may be the process solutions having the same ingredient to perform the same process. Process solutions filled in each of the treating baths of the first to third sub treating units 31, 32 and 33 may be the solutions having a different ingredient to perform the same process. Process solutions filled in each of the treating baths of the first to third sub treating units 31, 32 and 33 may be the solutions having a different ingredient to perform different processes.

Figure 2:
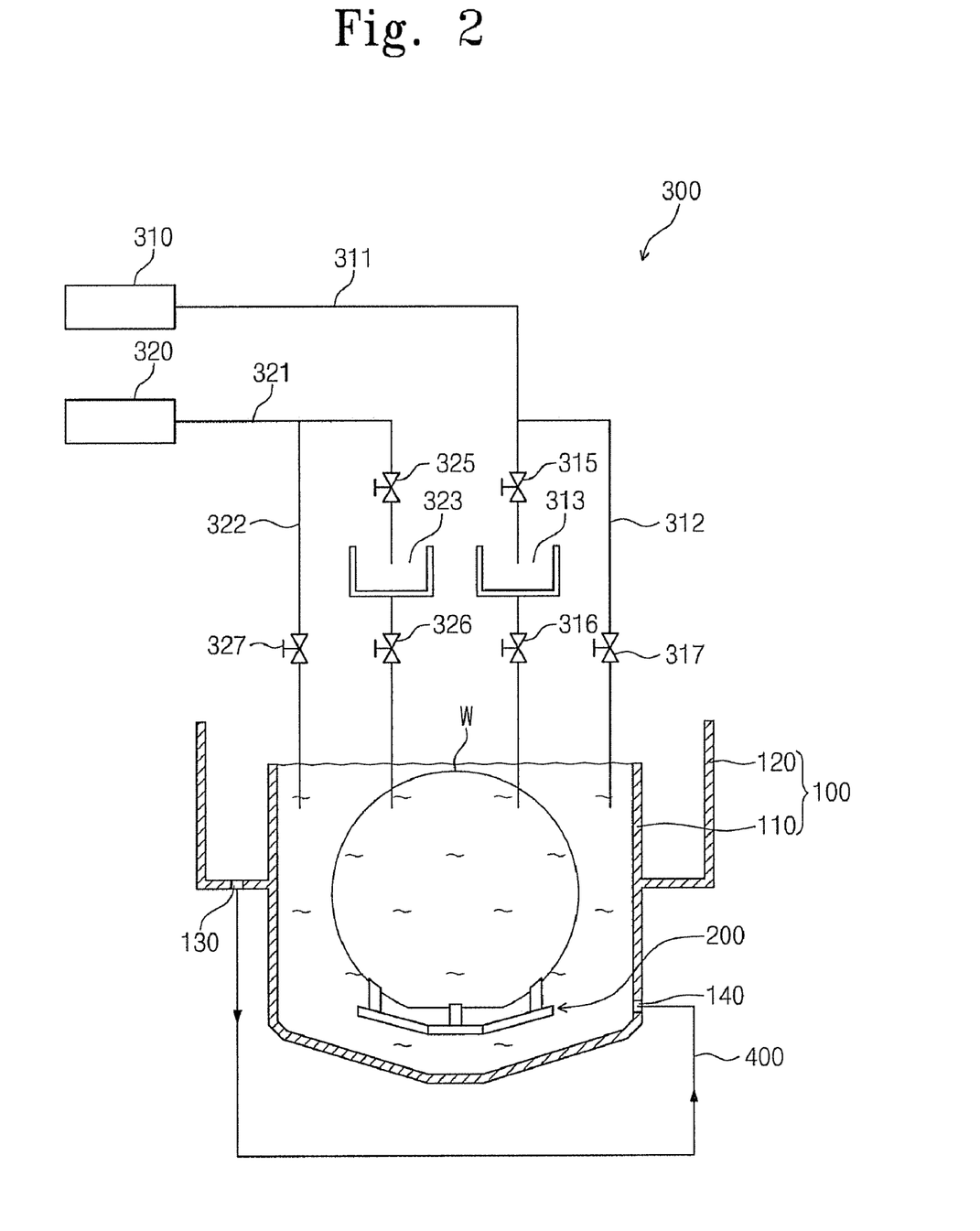
FIG. 2 is a schematic view of a sub treating unit depicted in FIG. 1.

FIG. 2 is a schematic view of a sub treating unit depicted in FIG. 1. FIG. 2 depicts one of the first to third treating units 31, 32 and 33 and a structure depicted in FIG. 2 can be applied to all the first to third treating units 31, 32 and 33.

Referring to FIG. 2, a sub treating unit includes a treating bath 100, a substrate supporting unit 200 installed in the treating bath 100, a supply portion 300 and a circulation portion 400. A process with respect to a semiconductor substrate such as a wafer W is performed in the treating bath 100. The supply portion 300 provides a process solution to the treating bath 100. The circulation portion 400 circulates a process solution provided to the treating bath 100.

More specifically, the treating bath 100 includes an inner bath 110 and an outer bath 120. The inner bath 110 has an opened top so that a process solution is provided from an upper portion. The inner bath 110 includes a drain hole (not shown) in a bottom surface to discharge the process solution. The outer bath 120 surrounds an outer side of the inner bath 110 to accommodate a process solution overflowing from the inner bath 110.

A supporting unit 200 supporting a wafer W is installed inside the inner bath 110 during a process. A detailed structure of the supporting unit 200 is described later.

The outer bath 120 includes an outlet 130 and the inner bath 110 includes an inlet 140. The outlet 130 and the inlet 140 are connected to the circulating portion 400. The circulation portion 400 circulates a process solution flowing out from the outlet 130 and provides the process solution to the treating bath 100 through the inlet 140. An ingredient of a process solution varies due to a reaction to a wafer W during a process, so that a function of the process solution applied to the process may become weaken. The circulation portion 400 circulates the process solution and maintains an ingredient of the process solution during a process.

The supply portion 300 provides two different process solutions. Hereinafter, the two process solutions are referred as a first process solution and a second process solution, respectively. The supply portion 300 includes a first vessel 310 in which the first process solution is stored and a first supply line 311 through which the first process solution moves. A first auxiliary supply line 312 branches off from a predetermined position of the first supply line 311. The first auxiliary supply line 312 is connected to the treating bath 100. One side of the first supply line 311 is connected to the first vessel 310 and the other side of the first supply line 311 is connected to the treating bath 100. A first auxiliary vessel 313 is disposed on the first supply line 311. Valves 315 and 316 are installed at both sides of the first auxiliary vessel 313 which is disposed on the first supply line 311, respectively. Also, a valve 317 is installed on the first auxiliary supply line 312. The valves 315, 316 and 317 control a flow of the first process solution.

Similarly, the supply portion 300 includes a second vessel 320, a second supply line 321, a second auxiliary supply line 322, a second auxiliary vessel 323 and a plurality of valves 325, 326 and 327.

The first supply line 311 provides the first process solution to the treating bath 100, the first auxiliary vessel 313 controls an amount of the first process solution which is provided to the treating bath 100, and the first auxiliary supply line 312 complements a supply of the first process solution. Similarly, the second supply line 321 provides the second process solution to the treating bath 100, the second auxiliary vessel 323 controls an amount of the second process solution which is provided to the treating bath 100, and the second auxiliary supply line 322 complements a supply of the second process solution.

If a process performed in the treating bath 100 is a cleaning process for cleaning a wafer W, the process solution may be a compound of sulphuric acid and hydrogen peroxide. In this case, the first process solution is sulphuric acid and the second process solution is hydrogen peroxide. The sulphuric acid and the hydrogen peroxide are stored in separate first and second vessels 310 and 320, respectively, separately supplied and mixed in the treating bath 100.

A wet cleaning such as a method of SC-1 may be applied to a wafer cleaning. In this case, the process solution includes hydrogen peroxide, ammonium hydroxide and deionized water. If the process solution includes three solutions having a different ingredient, the supply portion 300 additionally needs a separate vessel, a supply line, a auxiliary supply line, a auxiliary vessel and a plurality of valves. If the process solution is a compound of more than four solutions, separate vessels are needed according to a kind of a process solution. If only one kind of solution is used as the process solution, the second vessel 320, the second supply line 321, the second auxiliary supply line 322, the second auxiliary vessel 323 and a plurality of valves 325, 326 and 327 may be omitted.

Figure 3:
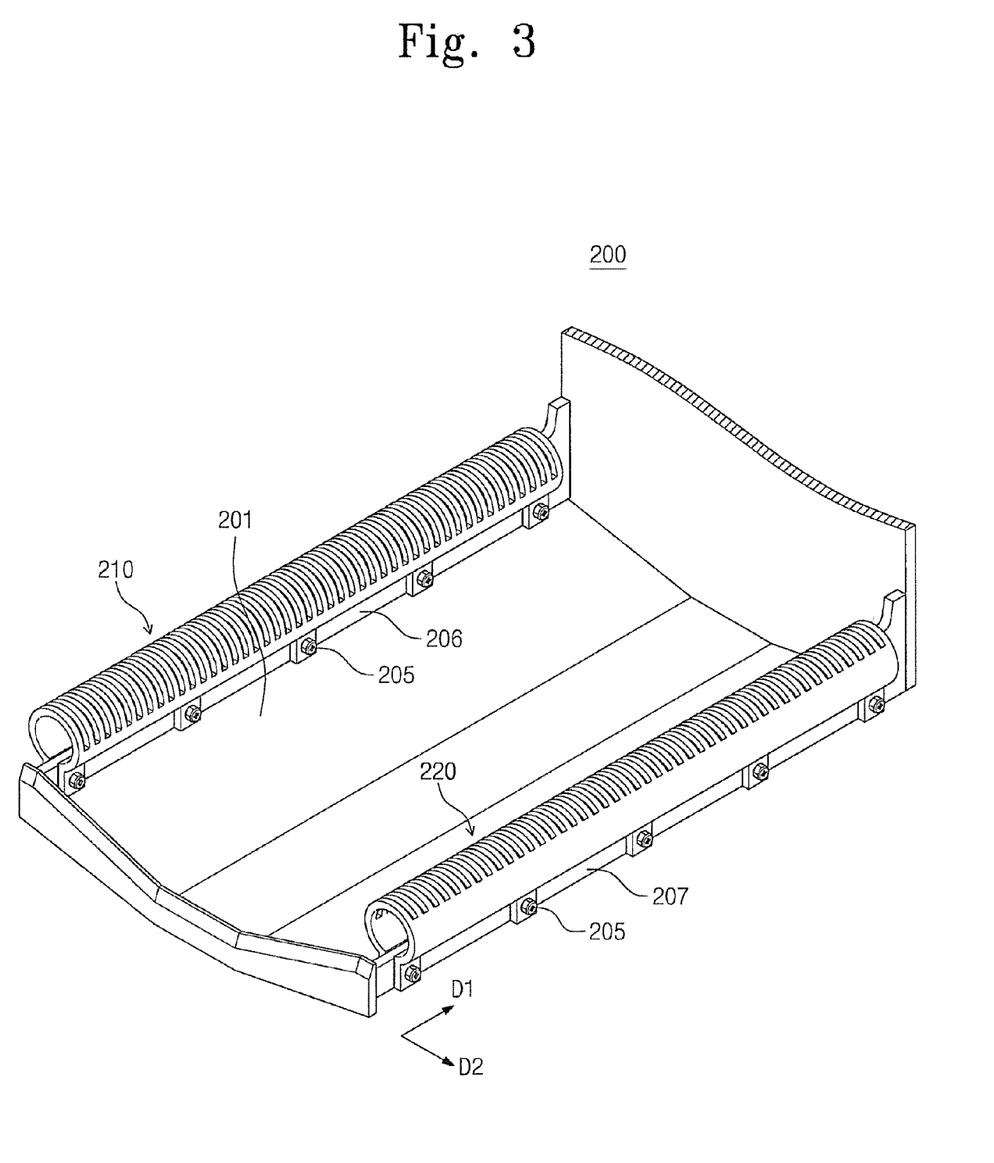
FIG. 3 is a perspective view of a substrate supporting unit depicted in FIG. 2.
Figure 4A:
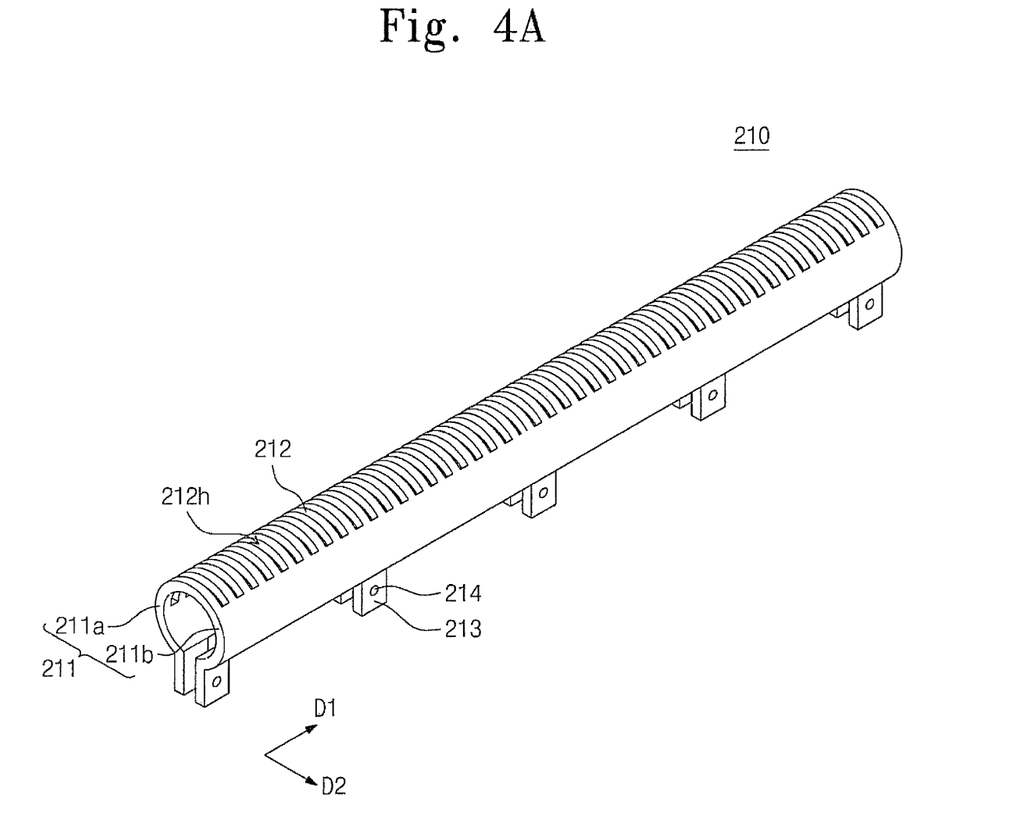
FIG. 4a is a perspective view of a substrate supporting unit depicted in FIG. 3.
Figure 4B:
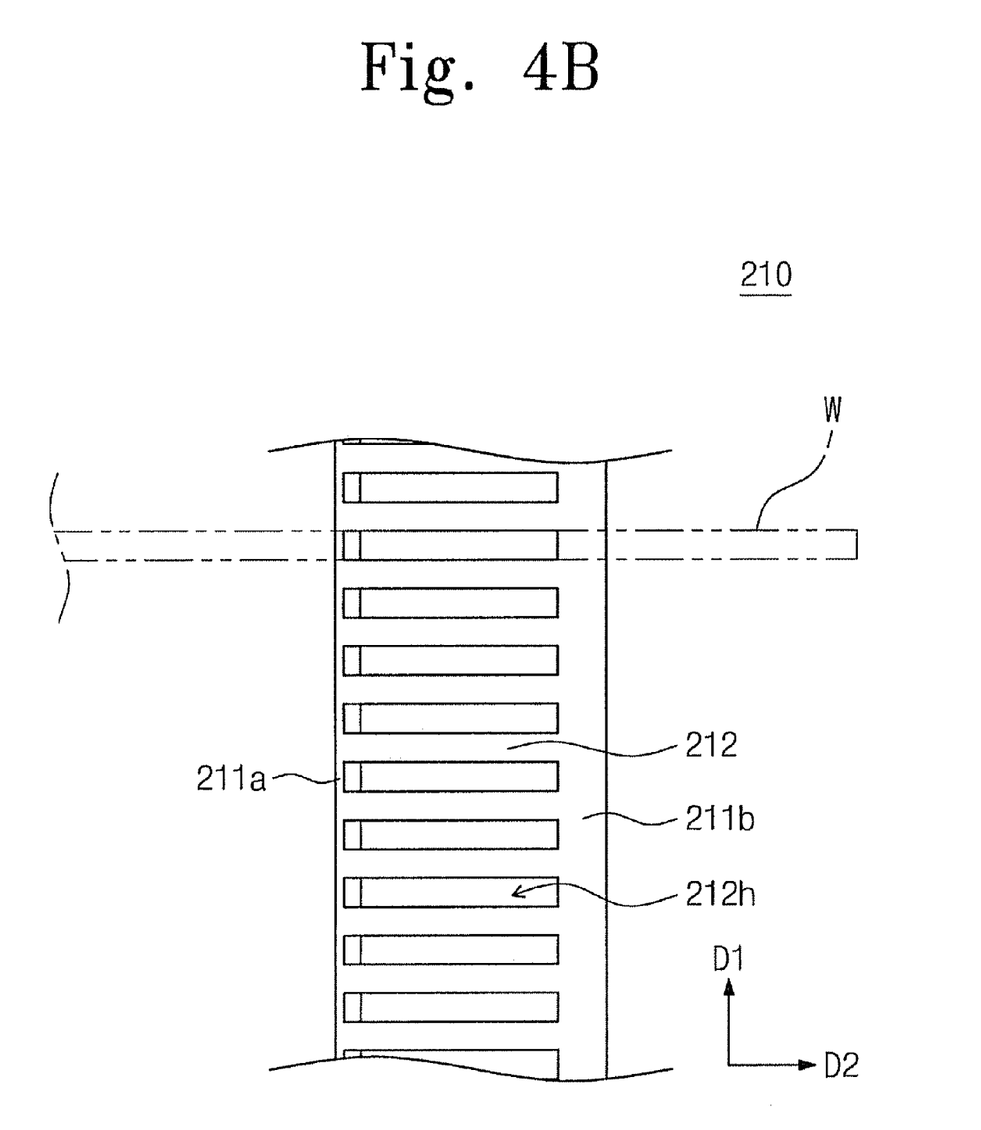
FIG. 4b is a top plan view of a supporting portion of a substrate supporting unit depicted in FIG. 3.

FIG. 3 is a perspective view of a substrate supporting unit depicted in FIG. 2, FIG. 4a is a perspective view of a substrate supporting unit depicted in FIG. 3 and FIG. 4b is a top plan view of a supporting portion of a substrate supporting unit depicted in FIG. 3.

Referring to FIG. 3, the substrate supporting unit 200 includes a base plate 201 and a supporting portion 210 and 220. The base plate 201 has a V shape that a center of the base plate 201 is concave. The supporting portion 210 and 220 is composed of more than one. The supporting portion 210 includes a first supporting portion 210 and a second supporting portion 220. The first and second supporting portions 210 and 220 face each other and are disposed at edges of the base plate 201. A portion of circumference of a wafer W is supported at two points by the first and second supporting portions 210 and 220.

The first and second supporting portions 210 and 220 protrude from the base plate 201 and may be unified with the base plate 201. Alternatively, the first and second supporting portions 210 and 220 may be separately made and connected to the base plate 201. In this case, as shown in FIG. 3, a first connecting rod 206 and a second connecting rod 207 are formed on the base plate 201. The first supporting portion 210 is connected to the first connecting rod 206 by a connecting member 205 like a screw and the second supporting portion 220 is connected to the second connecting rod 207 by a connecting member 205 like a screw.

Referring to FIG. 4a, the first supporting portion 210 includes two supporting rods 211 and a plurality of supporting members 212. The two supporting rods 211 face each other and extend in a predetermined direction. Hereinafter, a direction in which the supporting rod 211 extends is referred to as a first direction D1 and a direction which is perpendicular to the first direction is referred to as a second direction D2. The two supporting rods 211 are connected to each other by the supporting member 212. A plurality of supporting members 212 are uniformly arranged in the first direction D1.

Each of the supporting members 212 has partially a ring shape and the ring shape part connects the two supporting rods 211 to each other. Although the supporting member 212 has a circular ring shape in FIG. 4a, a shape of the supporting member 212 is not limited to a ring shape. For example, the supporting member 212 may have a square ring shape or a triangular ring shape.

The two supporting rods 211 and a plurality of the supporting members 212 form one body. A slot 112h is formed in the body between adjacent supporting members 212 and a wafer W is supported by being inserted in the slot 212h.

Each of the two supporting rods includes a connecting plate 213 extending in a lower direction and a penetrating hole 214 is formed in the connecting plate 213. The first supporting member 210 is connected to the first connecting rod 206 by the connecting member 205 inserted in the penetrating hole 214. The first connecting rod 206 is formed to be one body. One supporting rod 211a between the two supporting rods 211 is connected to one side of the first connecting rod 206 and the other supporting rod 211b is connected to the other side of the first connecting rod 206. Alternatively, the first connecting rod 206 may have two divided bodies so that the divided first connecting rods 206 are respectively connected to the two supporting rods 211. The connecting plate 213 and the penetrating hole 214 described above are one embodiment for connecting the supporting portion 210 to the first connecting rod 206 and various connecting structures may be applied.

The second supporting portion 220 and the second connecting rod 207 have structures corresponding to the first supporting portion 210 and the first connecting rod 206. A detailed description of this is omitted.

Referring to FIG. 4b, wafers W are inserted into the slots 212h between adjacent supporting members 212 in the second direction D2. A distance between adjacent two supporting members 212 corresponds to a thickness of a wafer W. One side of a wafer is in contact with one side of any one supporting member 212 between adjacent two supporting members 212 and the other side of the wafer is in contact with the other supporting member 212.

Thus, a wafer W may be uniformly supported at both sides of the wafer W by adjacent two supporting member 212. Since the supporting member 212 has a ring shape, an area of the ring shape is in contact with a wafer W. Since an area of the supporting member 212 which is in contact with a wafer W is large, the supporting member 212 has an advantage that a wafer W is stably supported.

A substrate supporting unit that stably supports a wafer W using a supporting member having a ring shape has various embodiments. At an exemplary point of view, some embodiments will be described. Description of common features already discussed above is omitted for brevity.

Figure 5:
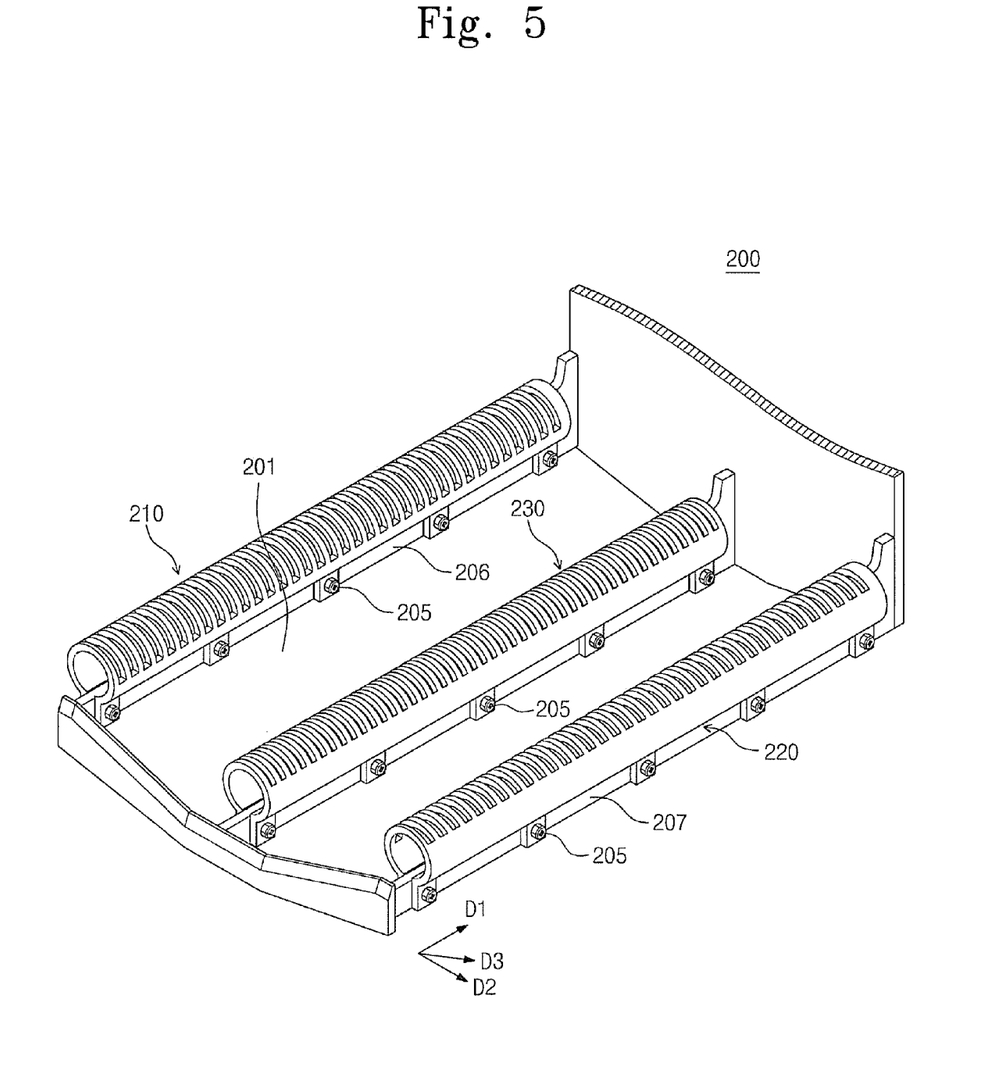
FIG. 5 is a perspective view of a substrate supporting unit according to some embodiments of the present invention.
Figure 6A:
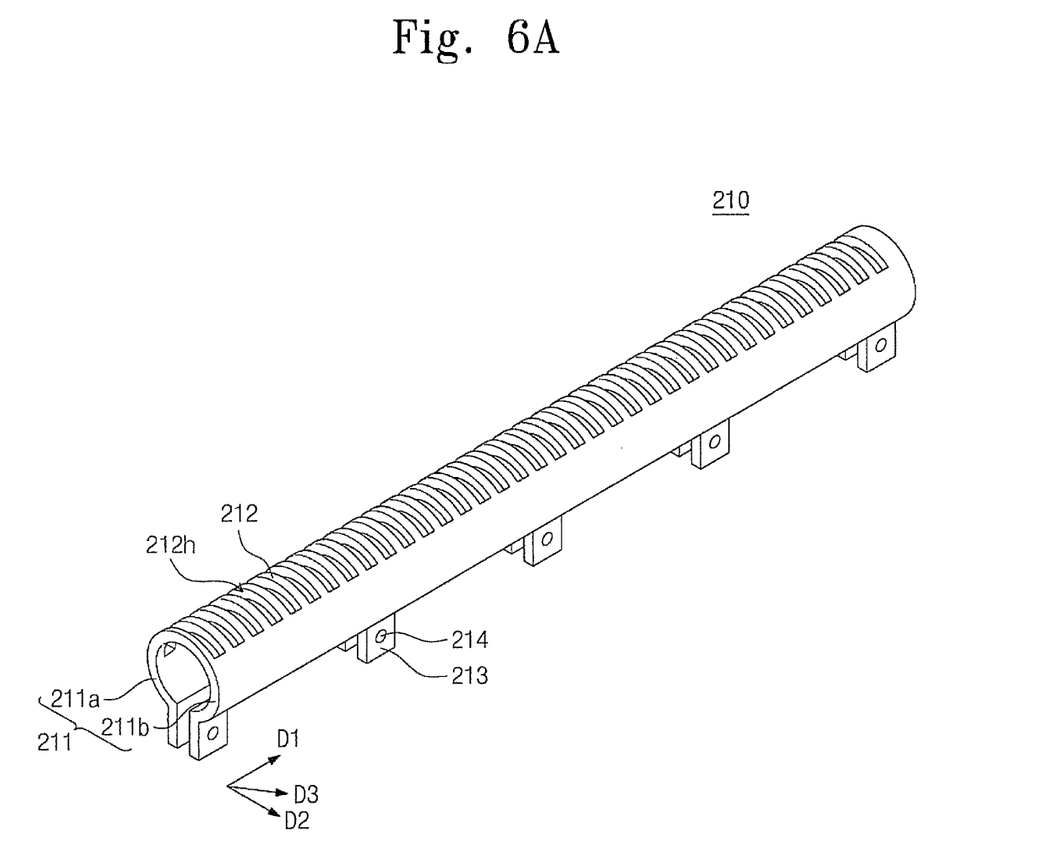
FIG. 6a is a supporting portion perspective view of a substrate supporting unit depicted in FIG. 5.
Figure 6B:
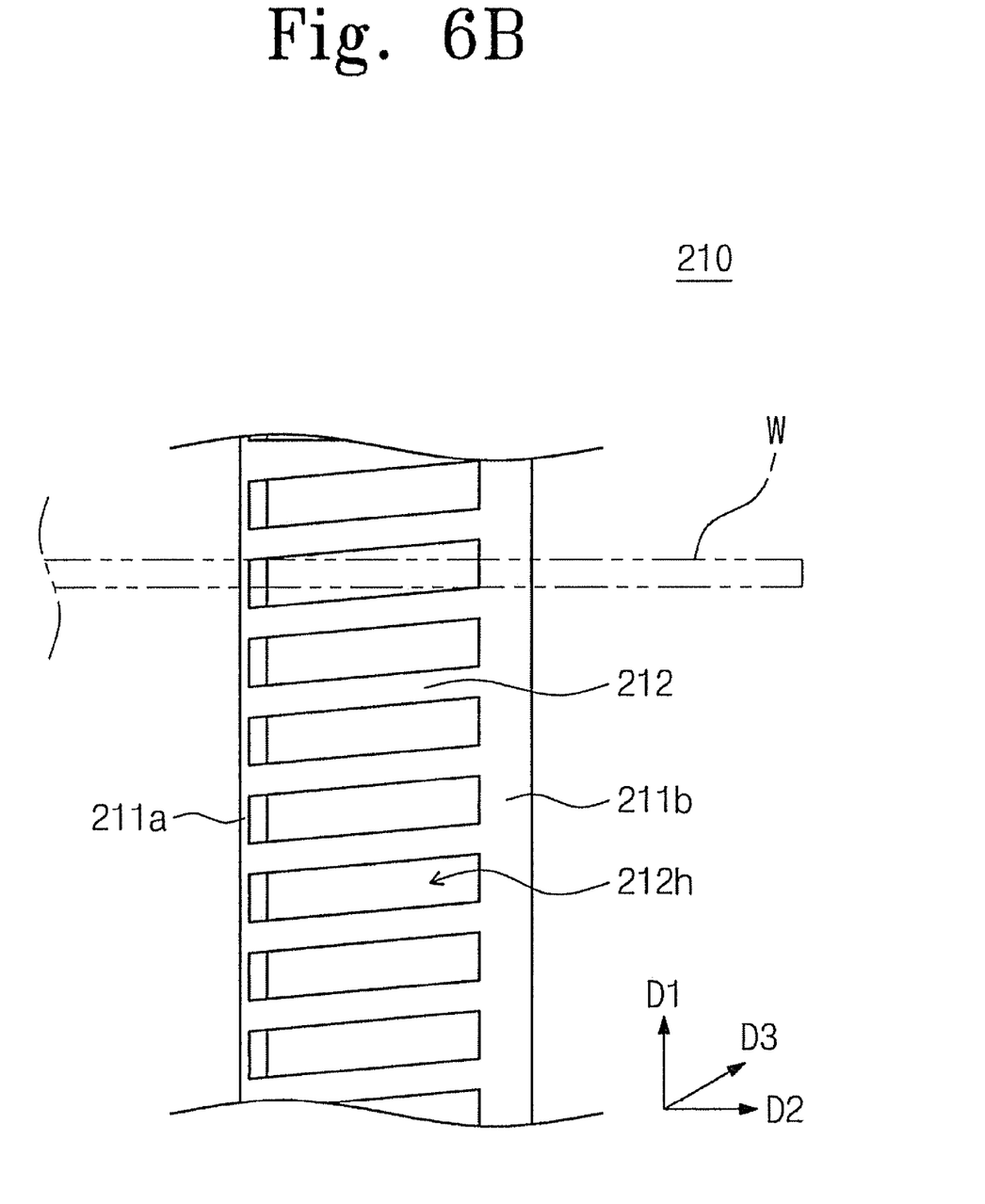
FIG. 6b is a top plan view of a supporting portion of a substrate supporting unit depicted in FIG. 5.

FIG. 5 is a perspective view of a substrate supporting unit according to some embodiments of the present invention, FIG. 6a is a supporting portion perspective view of a substrate supporting unit depicted in FIG. 5 and FIG. 6b is a top plan view of a supporting portion of a substrate supporting unit depicted in FIG. 5.

Referring to FIGS. 5, 6a and 6b, a substrate unit 200 includes a base plate 201 and a plurality of supporting portions 210, 220 and 230. The base plate 201 has concave portion in a center of the base plate 201. A first plate supporting portion 210 and a second supporting portion 220 are disposed on edges of the base plate 201 and a third supporting portion 230 is disposed on the concave portion in a center of the base plate 201. A portion of circumference of a wafer W is supported at three points by the first, second and third supporting portions 210, 220 and 230. The third supporting portion 230 supports the lowest portion of a wafer W when the wafer W is disposed on supporting portions in an upright position.

The first to third supporting portions 210, 220 and 230 have a structure corresponding to each other. For example, the first supporting portion 210 includes two supporting rods 211 and a supporting member 212. The two supporting rods 211 extend in a first direction D1 and face each other. A first supporting rod 211a and a second supporting rod 211b constitute the two supporting rods 211. The first and second supporting rods 211a and 211b are connected to each other by the supporting member 212.

As depicted in FIG. 6a, a plurality of supporting members 212 are uniformly arranged in the first direction D1 and formed in a third direction D3 which is inclined with respect to a second direction D2 which is perpendicular to the first direction D1. The supporting member 212 has a ring shape and a slot 212h is formed between adjacent supporting members 212. A plurality of supporting members 212 have partially a spiral shape. If the supporting member 212 is formed to be inclined, a wafer W is disposed between supporting members 212 which are adjacent to each other in the first direction D1 and one of the two adjacent supporting members is in contact with an upper side of the wafer W and the other of the two adjacent supporting members is in contact with an lower side of the wafer W as depicted in FIG. 6b.

The upper side of a wafer W that is in contact with one of the two adjacent supporting members 212 and the lower side of wafer W that is in contact with the other of the two adjacent supporting members 212 are not correspondingly located. The upper side of a wafer W and the lower side of wafer W are correspondingly located with respect to a center of the slot 212h. Thus, the two adjacent supporting members 212 prevent the wafer W from being swayed, so that the wafer can be stably supported by the two adjacent supporting members 212. A contact area that the wafer W is in contact with the supporting member 212 is reduced as compared with aforementioned embodiment. A chemical solution cannot be reached to the contact area that the wafer W is in contact with the supporting member 212. Thus, an efficiency of a process is improved in the present embodiment.

If a declined angle of the supporting member 212 becomes too large, a wafer W cannot maintain a flat state between the largely declined supporting members 212. An inclined angle of the supporting member 212 has a limitation and the angle may be 10 degrees or less. At the same degree, a wafer W having a thin thickness can easily maintain a flat state. An inclined angle of the supporting member 212 corresponds to a thickness of a wafer W. Thus, the thicker a wafer W is, the less an inclined angle is.

The second and third supporting portions 220 and 230 correspond to the first supporting member 210 and include two supporting rods and a plurality of supporting members. The supporting members of the second and third supporting portions 220 and 230 incline to the third direction D3. A detailed description of the second and third supporting portions 220 and 230 is omitted.

Figure 7:
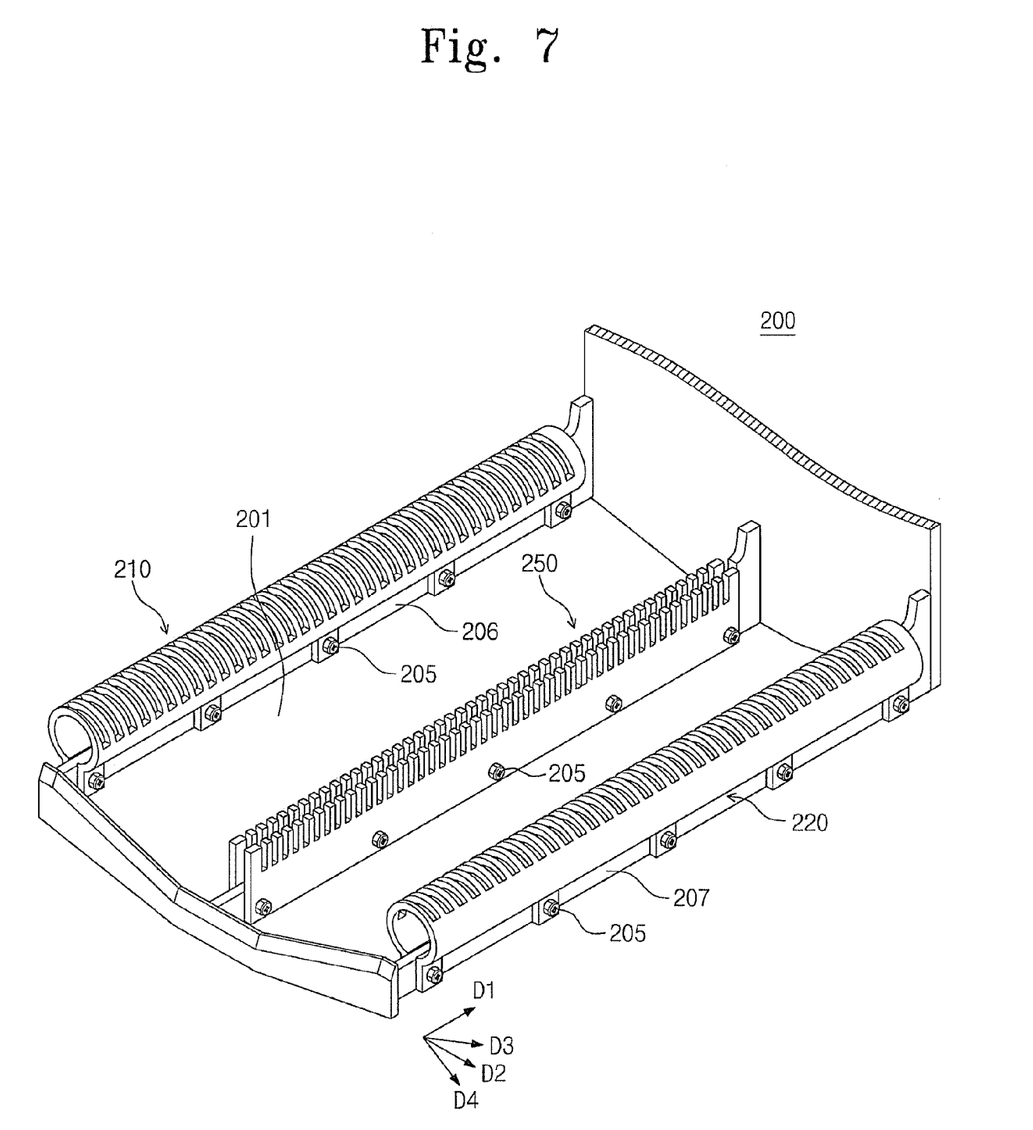
FIG. 7 is a perspective view of a substrate supporting unit according to some embodiments of the present invention.
Figure 8A:
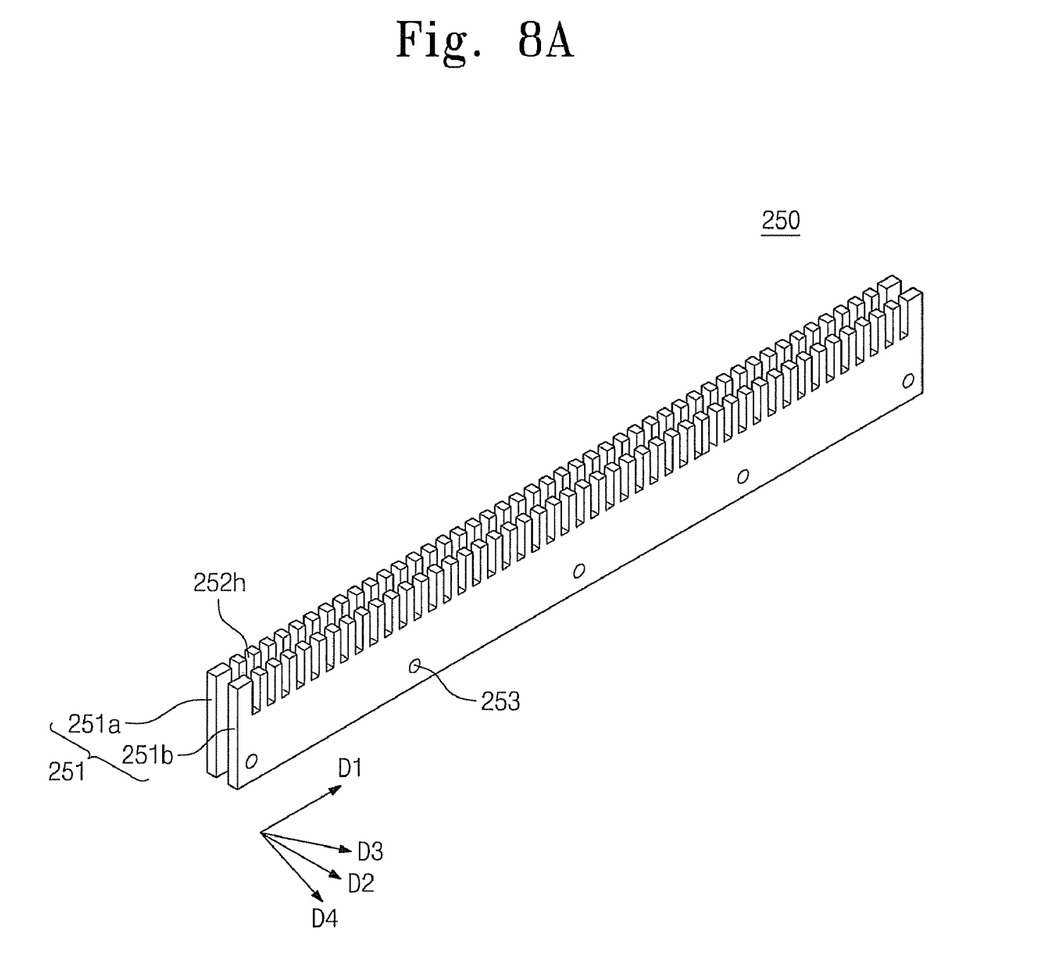
FIG. 8a is a perspective view of an auxiliary supporting portion of a substrate supporting unit depicted in FIG. 7.
Figure 8B:
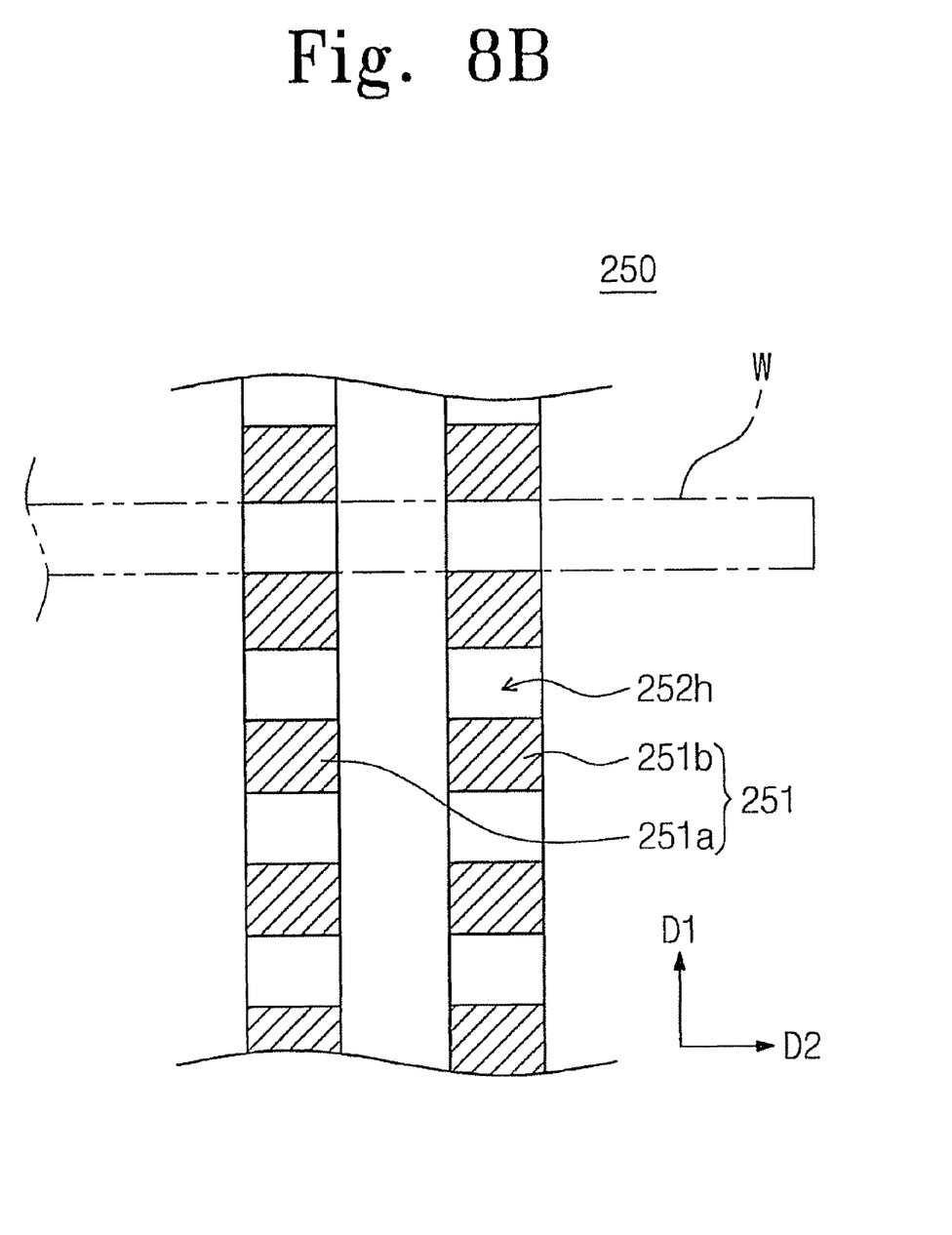
FIG. 8b is a top plan view of a supporting portion of a substrate supporting unit depicted in FIG. 7.

FIG. 7 is a perspective view of a substrate supporting unit according to some embodiments of the present invention, FIG. 8a is a perspective view of an auxiliary supporting portion of a substrate supporting unit depicted in FIG. 7 and FIG. 8b is a top plan view of a supporting portion of a substrate supporting unit depicted in FIG. 7.

Referring to FIG. 7, a base plate 201 and supporting portions 210 and 220 are provided. The supporting portions 210 and 220 include a first supporting portion 210 and a second supporting portion 220 disposed on edges of the base plate 201. The first and second supporting portions 210 and 220 have the same structure as the aforementioned embodiment except that an inclined direction of each of the supporting members is symmetrical. That is, the supporting members of the first supporting portion 210 are inclined to the third direction D3 and the supporting members of the second supporting portions 220 are inclined to a fourth direction D4 that is symmetrical to the third direction D3 with respect to the second direction D2. Inclined directions of the supporting members may be disposed to be equal.

The base plate 201 has a concave shape in a center portion between the first and second supporting portions 210 and 220. An auxiliary supporting portion 250 is disposed on the center portion of the base plate 201. As a result, a portion of a circumference of a wafer W is supported by the first supporting portion 210, the auxiliary supporting portion 250 and the second supporting portion 220.

Referring to FIG. 8a, the auxiliary supporting portion 250 extends in the first direction D1 and includes a first auxiliary supporting rod 251a and a second auxiliary supporting rod 251b spaced apart from each other. Slots 252h are formed on each of the first and second auxiliary supporting rods 251a and 251b. Penetrating holes 253 are formed in each of the first and second auxiliary supporting rods 251a and 251b so that the first and second auxiliary supporting rods 251a and 251b are connected to the base plate 201.

Referring to FIG. 8b, the slots 252h formed in the first and second auxiliary supporting rods 251a and 251b are correspondingly disposed in the second direction D2. As a result, a wafer W is supported by being inserted into corresponding two slots 252h. Since the auxiliary supporting portion 250 supports a wafer W by only assisting the supporting portions 210 and 220, it is not necessary for the auxiliary supporting portion 250 to have the same supporting power as the supporting portions 210 and 220. Thus, the number of the auxiliary supporting rod constituting the auxiliary supporting portion 250 may be flexible. For example, the second auxiliary supporting rod 251b may be omitted or another auxiliary supporting rod may be added besides the first and second auxiliary supporting rods 251a and 251b.

Figure 9:
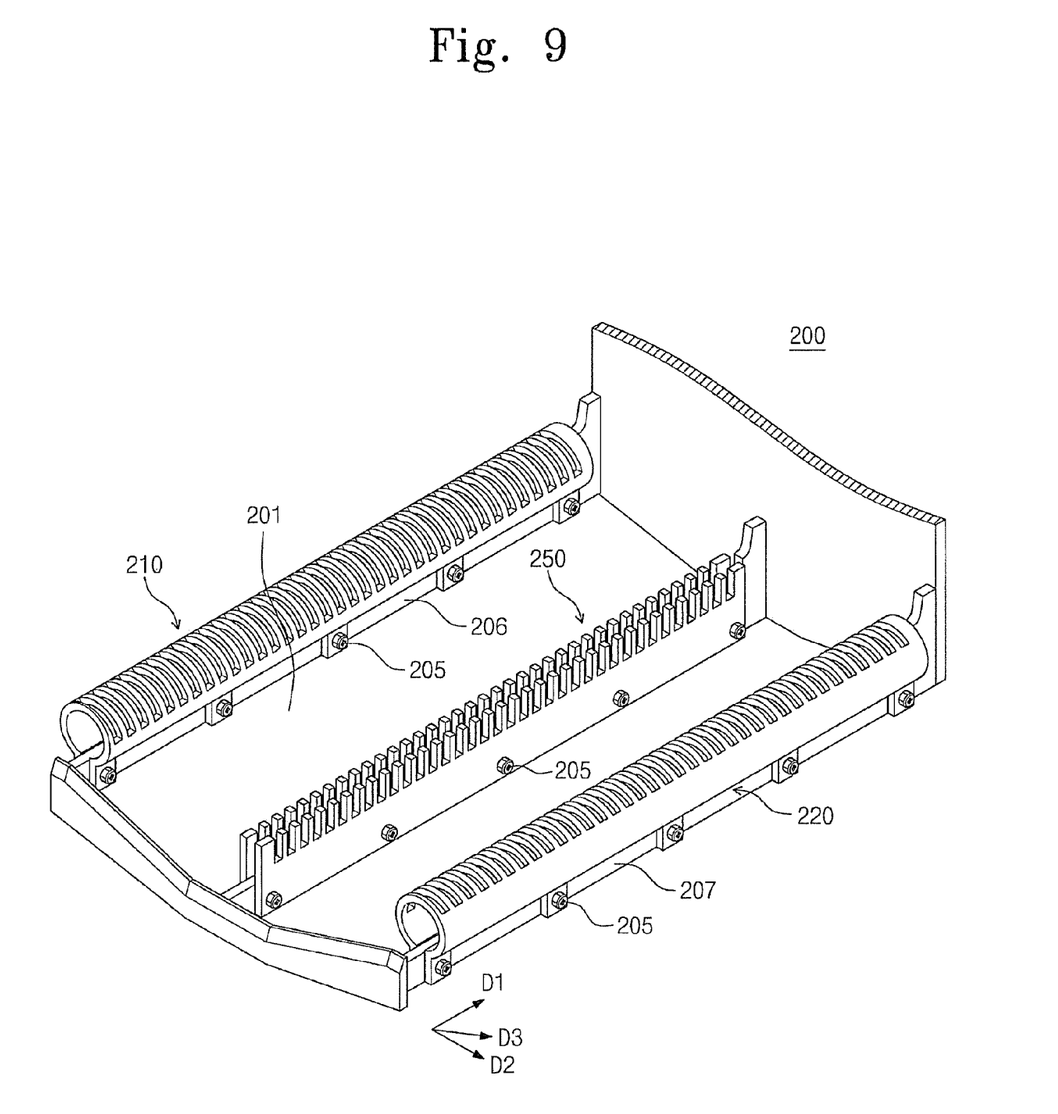
FIG. 9 is a perspective view of a substrate supporting unit according to some embodiments of the present invention.
Figure 10A:
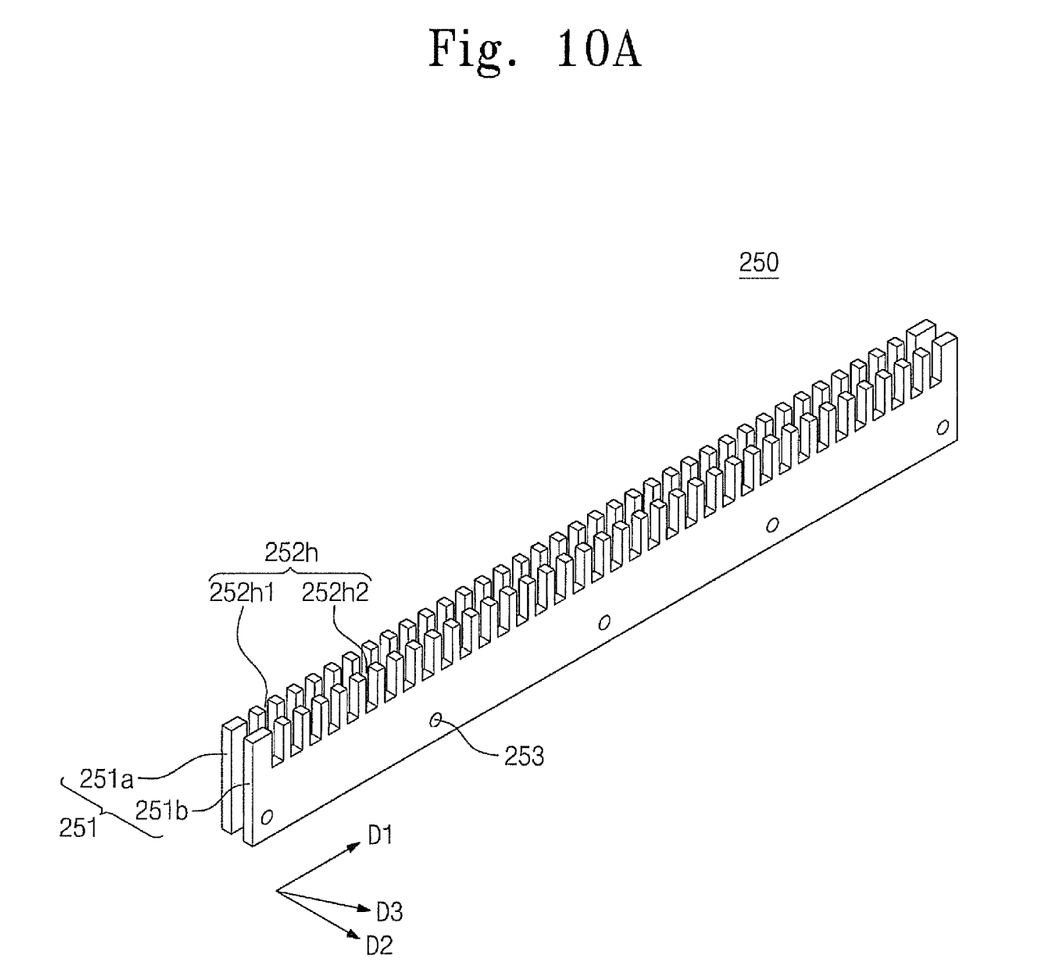
FIG. 10a is a perspective view of an auxiliary supporting portion of a substrate supporting unit depicted in FIG. 9.
Figure 10B:
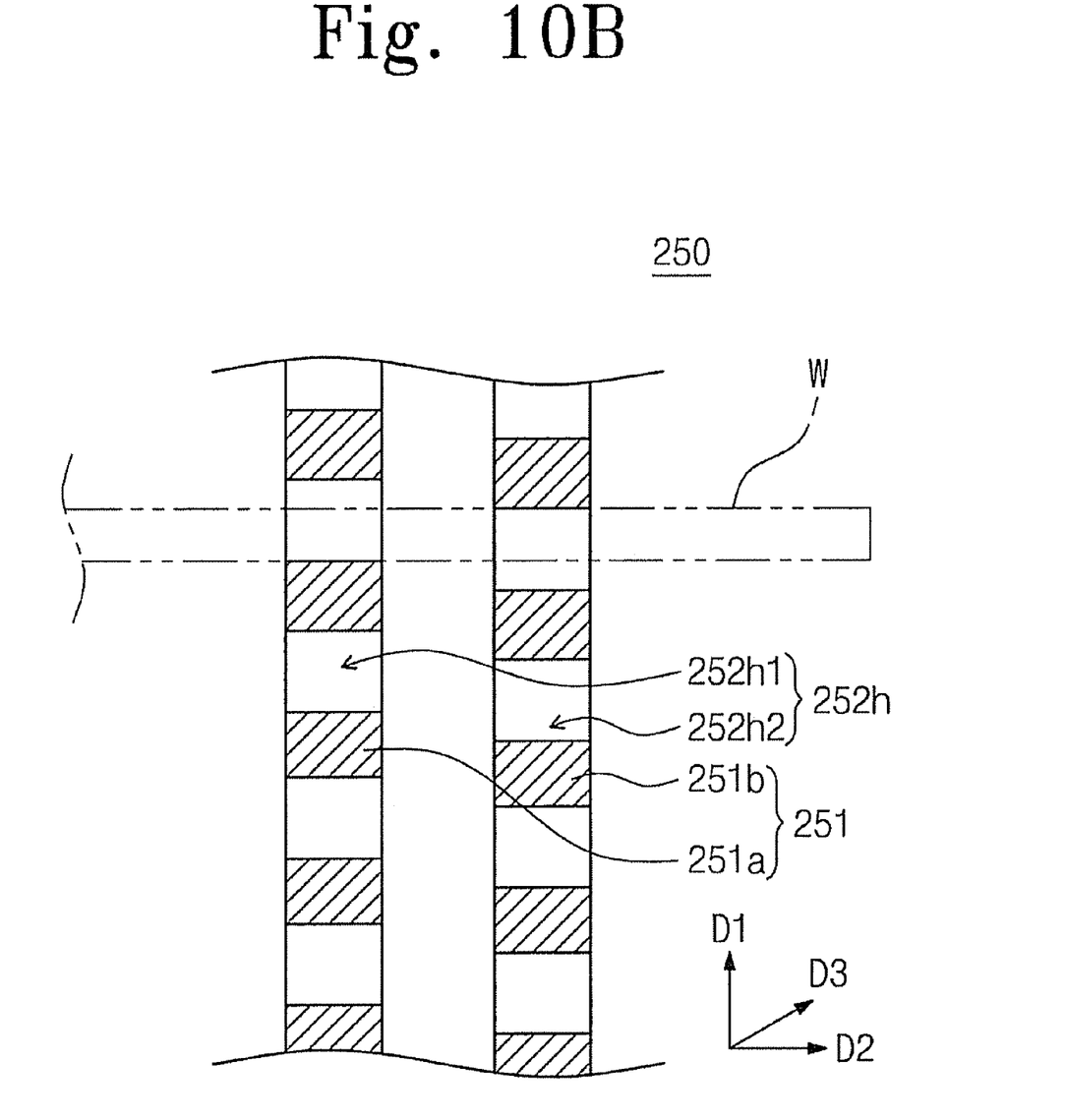
FIG. 10b is a top plan view of an auxiliary supporting portion of a substrate supporting unit depicted in FIG. 9.

FIG. 9 is a perspective view of a substrate supporting unit according to some embodiments of the present invention, FIG. 10a is a perspective view of an auxiliary supporting portion of a substrate supporting unit depicted in FIG. 9 and FIG. 10b is a top plan view of an auxiliary supporting portion of a substrate supporting unit depicted in FIG. 9.

Referring to FIG. 9, a base plate 201, an auxiliary supporting portion 250, the first and second supporting portions 210 and 220 are provided. The auxiliary supporting portion 250, the first and second supporting portions 210 and 220 are sequentially installed on the base plate 201 in a second direction D2. Supporting members of each of the first and second supporting portions 210 and 220 are formed to be inclined with respect to a third direction D3.

Referring to FIG. 10a, the auxiliary supporting portion 250 extends in a first direction D1 and includes a first auxiliary supporting rod 251a and a second auxiliary supporting rod 251b. Slots 252h are formed on each of the first and second auxiliary supporting rods 251a and 251b. The slot 252h of the first auxiliary supporting rod 251a is referred to as a first slot 252h1 and the slot 252h of the second auxiliary supporting rod 251b is referred to as a second slot 252h2. A center line of the first slot 252h1 is not coincident with a center line of the second slot 252h2.

Referring to FIG. 10b, the first and second slots 252h1 and 252h2 are correspondingly disposed in the third direction D3. Thus, the first slot 252h1 is in contact with one side of a wafer W and the second slot 252h2 is in contact with opposite side of the wafer W. This structure prevents a wafer W from being swayed and more stably supports the wafer W.

What is claimed is:
1. A substrate supporting unit, comprising:
a base plate; and
a supporting portion that is formed on the base plate and supports a plurality of substrates arranged in a first direction,
wherein the supporting portion comprises:
two supporting rods that extend in the first direction and are separated from each other; and
a plurality of partially spiral shaped supporting members which are arranged to be separated from each other in the first direction and inclined at an angle with respect to a second direction, the supporting members connecting the supporting rods and being in contact with each of the substrates.

2. The substrate supporting unit of claim 1, further comprising a connecting rod that extends in the first direction and protrudes from the base plate, and wherein the supporting rods are connected to the connecting rod.

3. The substrate supporting unit of claim 1, wherein the second direction is perpendicular to the first direction.

4. The substrate supporting unit of claim 3, wherein two supporting members which are adjacent to each other in the first direction support a single substrate inserted between the two supporting members, and one of the adjacent two supporting members is in contact with an upper side of the single substrate and the other supporting member is in contact with a lower side of the single substrate.

5. The substrate supporting unit of claim 3, wherein the supporting portion includes a first supporting portion and a second supporting portion which are formed in parallel and separated from each other, and the supporting members of the first and second supporting portions are inclined to the same direction.

6. The substrate supporting unit of claim 3, wherein the supporting portion includes a first supporting portion and a second supporting portion which are formed in parallel and separated from each other, and the supporting members of the first and second supporting portions are inclined to a symmetrical direction.

7. The substrate supporting unit of claim 3, wherein an inclined angle of the supporting members with respect to the second direction is 10 degrees or less.

8. The substrate supporting unit of claim 1, wherein the supporting members have partially a ring shape of a circle when viewed toward the first direction.

9. The substrate supporting unit of claim 1, further comprising an auxiliary supporting portion that is formed on the base plate at least one and includes slots in the first direction so as to support a plurality of the substrates.

10. The substrate supporting unit of claim 9, wherein the auxiliary supporting portion includes at least two auxiliary supporting rods, the auxiliary supporting rods extending in the first direction so as to be separated from each other and having the slots formed on each of the two auxiliary supporting rods.

11. The substrate supporting unit of claim 9, wherein the supporting portion includes a first supporting portion and a second supporting portion which are symmetrically disposed to be separated from both sides of the auxiliary supporting portion.

12. A substrate treating apparatus, comprising:
a treating bath in which a process is performed with respect to substrates; and
a substrate supporting unit which is disposed inside the treating bath during a process and supports the substrates so that the substrates are vertically located on the supporting unit,
wherein the substrate supporting unit comprises:
a base plate; and
a supporting portion that is formed on the base plate and supports the substrates arranged in a first direction,
wherein the supporting portion comprises:
two supporting rods that extend in the first direction and are separated from each other; and
a plurality of partially spiral shaped supporting members which are arranged to be separated from each other in the first direction and inclined at an angle with respect to a second direction, the supporting members connecting the supporting rods and being in contact with each of the substrates.

13. The substrate treating apparatus of claim 12, wherein the second direction is perpendicular to the first direction.

14. The substrate treating apparatus of claim 13, wherein two supporting members which are adjacent to each other in the first direction support a single substrate inserted between the two supporting members, and one of the adjacent two supporting members is in contact with an upper side of the single substrate and the other supporting member is in contact with a lower side of the single substrate.

* * * * *